(12) United States Patent
Li et al.

(10) Patent No.: US 8,225,847 B2
(45) Date of Patent: *Jul. 24, 2012

(54) HEAT DISSIPATION DEVICE WITH HEAT PIPE AND ELASTIC MEMBER

(75) Inventors: Wei Li, Shenzhen (CN); Yi-Qiang Wu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 742 days.

This patent is subject to a terminal disclaimer.

(21) Appl. No.: 12/397,355

(22) Filed: Mar. 4, 2009

(65) Prior Publication Data

US 2010/0059202 A1    Mar. 11, 2010

(30) Foreign Application Priority Data

Sep. 11, 2008  (CN) .......................... 2008 1 0304464

(51) Int. Cl.
*F28F 7/00*      (2006.01)
*H05K 7/20*     (2006.01)

(52) U.S. Cl. .................. 165/80.3; 361/700; 361/704

(58) Field of Classification Search .............. 165/80.3; 361/700, 704
See application file for complete search history.

(56) References Cited

U.S. PATENT DOCUMENTS

| | | | |
|---|---|---|---|
| 6,301,107 B1 * | 10/2001 | Lev et al. ................. | 361/679.52 |
| 6,504,720 B2 * | 1/2003 | Furuya ........................ | 361/699 |
| 6,570,761 B2 * | 5/2003 | Stone et al. .............. | 361/679.47 |
| 6,883,594 B2 * | 4/2005 | Sarraf et al. ............. | 165/104.33 |
| 7,283,362 B2 | 10/2007 | Lin et al. | |
| 7,312,997 B2 * | 12/2007 | Huang et al. ................... | 361/704 |
| 7,385,820 B1 | 6/2008 | Chen | |
| 7,414,850 B2 * | 8/2008 | Hung ........................... | 361/719 |
| 7,537,049 B2 * | 5/2009 | Cheng et al. ............. | 165/104.33 |
| 7,602,610 B2 * | 10/2009 | Ueda .............................. | 361/701 |
| 7,697,288 B2 * | 4/2010 | Okutsu .......................... | 361/695 |
| 7,855,889 B2 * | 12/2010 | Hung et al. ................... | 361/700 |
| 7,885,075 B2 * | 2/2011 | Li et al. .......................... | 361/701 |
| 8,050,038 B2 * | 11/2011 | Chen et al. .................... | 361/719 |
| 2007/0002537 A1 * | 1/2007 | Tomioka ....................... | 361/695 |
| 2007/0195500 A1 * | 8/2007 | Cheng et al. .................. | 361/697 |
| 2007/0251676 A1 * | 11/2007 | Cheng et al. ............. | 165/104.33 |
| 2010/0020501 A1 * | 1/2010 | Li et al. ......................... | 361/710 |
| 2010/0307719 A1 * | 12/2010 | Yang et al. .............. | 165/104.26 |
| 2011/0146949 A1 * | 6/2011 | Yang et al. ...................... | 165/67 |

FOREIGN PATENT DOCUMENTS

| | | |
|---|---|---|
| CN | 1964031 A | 5/2007 |
| CN | 101146428 A | 3/2008 |

* cited by examiner

*Primary Examiner* — Cheryl J Tyler
*Assistant Examiner* — Brandon M Rosati
(74) *Attorney, Agent, or Firm* — Altis Law Group, Inc.

(57) ABSTRACT

A heat dissipation device cooling an electronic device includes a conductive plate, a heat spreader received in the conductive plate and contacting the electronic device, a heat pipe connecting the conductive plate and the heat spreader, and an elastic member mounted on the conductive plate and pushing the heat spreader and the heat pipe in the heat spreader downwardly toward the electronic device.

16 Claims, 2 Drawing Sheets

HEAT DISSIPATION DEVICE WITH HEAT PIPE AND ELASTIC MEMBER

BACKGROUND OF THE INVENTION

1. Field of the Invention

The disclosure relates to heat dissipation, and more particularly, to a heat dissipation device with enhanced structural strength.

2. Description of Related Art

With development in computer technology, electronic devices operate at high speeds, at which considerable heat is generated. If the heat is not dissipated, the stability of the operation of the electronic devices will be impacted severely. Generally, a heat dissipation device is deployed to dissipate the heat generated by the electronic device.

Conventionally, a heat dissipation device comprises a conductive plate, a heat spreader thermally contacting the electronic device, and a heat pipe thermally connecting the heat spreader and soldered onto the conductive plate via a heat conducting material. However, with age, the heat pipe is prone to disengage from the conductive plate due to deterioration of the heat conducting material, resulting in diminished operation of the heat dissipation device.

What is needed, therefore, is a heat dissipation device which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
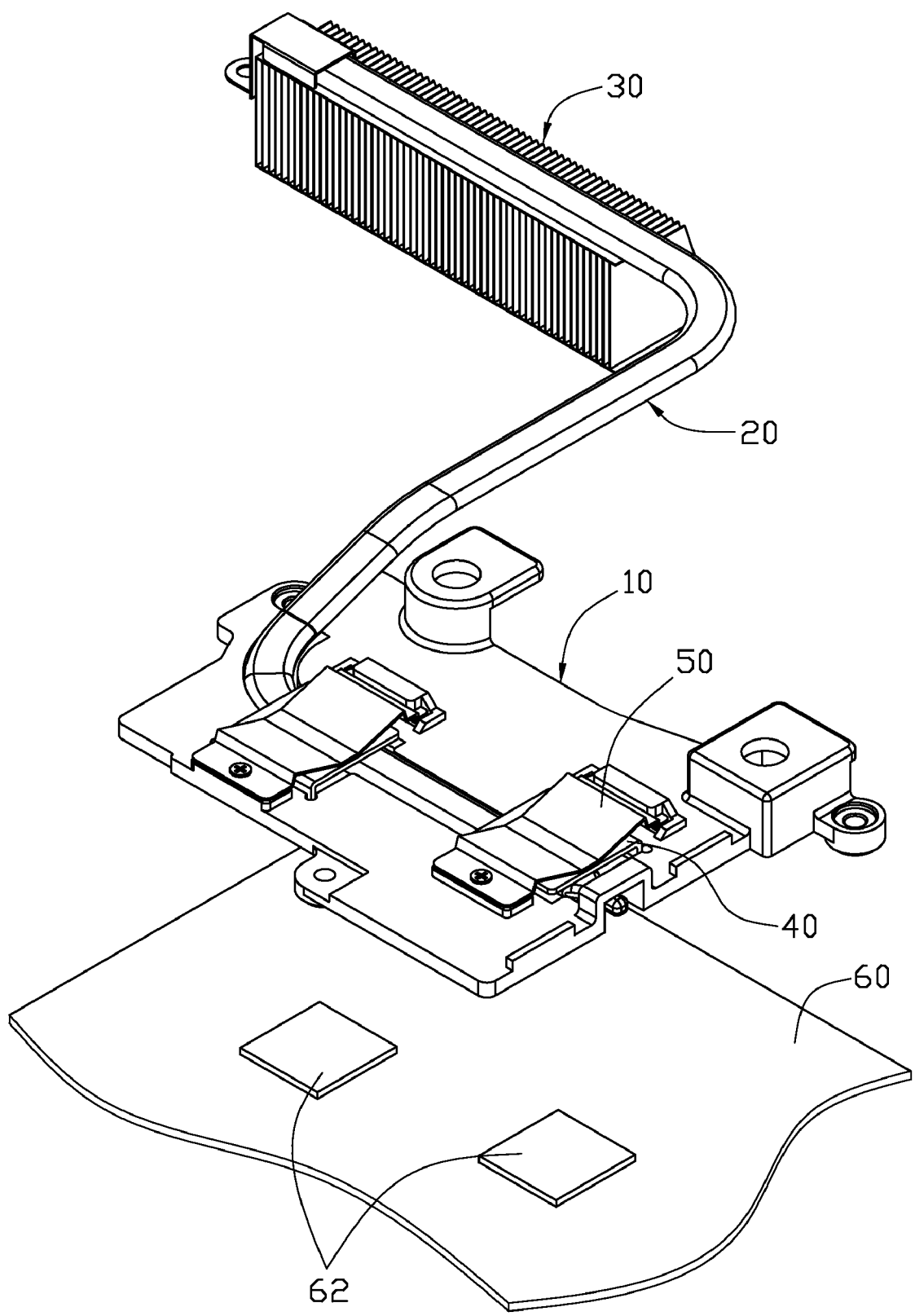
FIG. 1 is an isometric, assembled view of a heat dissipation device in accordance with an embodiment of the disclosure, with a printed circuit board located below the heat dissipation device.

FIG. 1 shows a heat dissipation device in accordance with an embodiment of the disclosure. The heat dissipation device, mounted on a printed circuit board 60, dissipates heat generated by two electronic devices 62 also mounted on the printed circuit board 60.

The heat dissipation device includes a conductive plate 10 located on the printed circuit board 60, a heat pipe 20 with a first end thereof received in and contacting the conductive plate 10, a fin assembly 30 attached to a second end of the heat pipe 20, two heat spreaders 40 attached to the first end of the heat pipe 20 and contacting the two electronic devices 62, and two elastic members 50 fixing the two heat spreaders 40 in the conductive plate 10.

Figure 2:
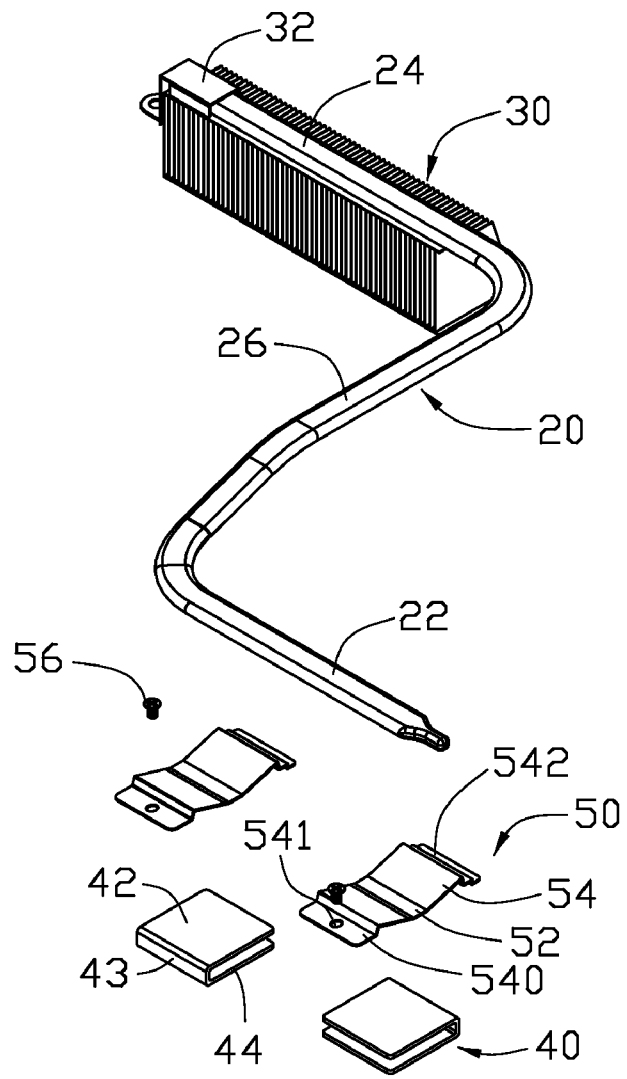
FIG. 2 is an exploded view of the heat dissipation device of FIG. 1.
Figure 2:
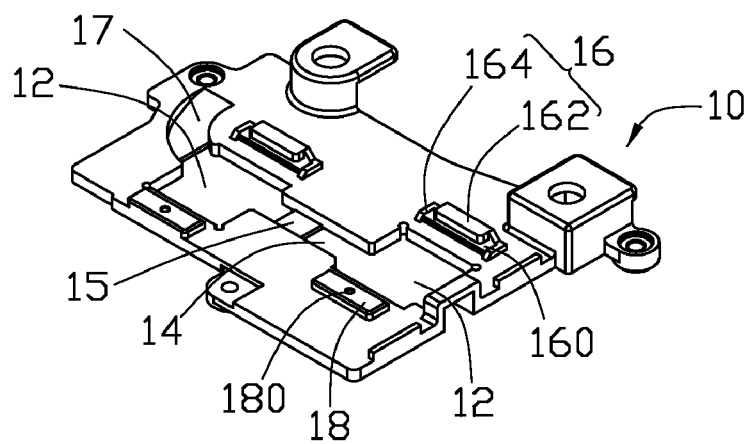

Also referring to FIG. 2, the conductive plate 10 is metal such as aluminum, copper or an alloy thereof. The conductive plate 10 defines two rectangular holes 12 receiving the two heat spreaders 40 therein. A channel 14 extends through the two rectangular holes 12, receiving the first end of the heat pipe 20. A supporting portion 15 is formed between the two holes 12 supporting the heat pipe 20. A receiving recess 17 is defined in a top surface of the conductive plate 10 and in communication with a left one of the holes 12 for receiving the heat pipe 20. The recess 17 has an inclined bottom surface with a depth decreasing from an end adjacent to the corresponding left hole 12 to another end distant from the corresponding left hole 12. The conductive plate 10 integrally forms a containing portion 16 and a protruding step 18 at two opposite sides of each rectangular hole 12, respectively. The containing portion 16 includes a bent plate 162 and two side plates 164 connected to the bent plate 162. The bent plate 162 extends upwardly from the top surface of the conductive plate 10 and then horizontally toward the rectangular hole 12. The bent plate 162 and the two side plates 164 cooperatively define a cavity 160 receiving an end of the elastic member 50 therein. The protruding step 18 defines a threaded hole 180 in a center thereof.

The heat pipe 20 comprises an evaporating section 22, a condensing section 24, and an adiabatic section 26 interconnecting the evaporating section 22 and the condensing section 24. The adiabatic section 26 has a slightly curved central portion thereof. The evaporating section 22 and the condensing section 24 are substantially perpendicular to corresponding end portions of, and located at two sides of, the adiabatic section 26. Two round corners are formed at corresponding joints of the evaporating section 22, the adiabatic section 26 and the condensing section 24. The heat pipe 20 is flattened and has top and bottom surfaces each formed by a plurality of flat surfaces in different planes. The evaporating section 22 of the heat pipe 20 is accommodated in the channel 14 of the conductive plate 10. The condensing section 24 of the heat pipe 20 is attached to the fin assembly 30.

The fin assembly 30 comprises a plurality of spaced and parallel fins (not labeled) stacked together. The fins each are metal such as aluminum, copper or an alloy thereof. A top surface of the fin assembly 30 thermally contacts the bottom surface of the condensing section 24 of the heat pipe 20. A clip 32 is attached to the fin assembly 30, securing the heat pipe 20 and the fin assembly 30 together, wherein, when the condensing section 24 of the heat pipe 20 is attached to the fin assembly 30, a first end of the clip 32 surrounds a distal end of the condensing section 24 of the heat pipe 20 and contacts the top surface of the fin assembly 30, and a second end of the clip 32 extends downwardly along a side surface of the fin assembly 30 and then outwardly beyond the fin assembly 30.

The two heat spreaders 40 are metal such as aluminum, copper or an alloy thereof. The heat spreaders 40 absorb heat from the electronic devices 62 and conveying it to the evaporating section 22 of the heat pipe 20. The two heat spreaders 40 are each integrally formed from a metal plate. The two heat spreaders 40 each have a U-shaped cross section and include a top sandwiching plate 42, a bottom sandwiching plate 44 parallel to the top sandwiching plate 42 and a connecting plate 43 interconnecting the top and bottom sandwiching plates 42, 44. The bottom sandwiching plate 44 has a first surface directly contacting a corresponding electronic device 62. The top sandwiching plate 42 has a second surface supporting a corresponding elastic member 50. The evaporating section 22 of the heat pipe 20 is sandwiched and soldered between the top and bottom sandwiching plates 42, 44 of the two heat spreaders 40.

The two elastic members 50 are each integrally formed from a metal sheet and fix the two heat spreaders 40 in the conductive plate 10. The two elastic members 50 each include a rectangular pressing portion 52 located at a center thereof, two arms 54 angling upwardly from two opposite sides of the pressing portion 52, two fixing portions 540, 542 angling downwardly from two distal ends of the two arms 54, respectively. The fixing portion 540 of each elastic member 50 defines a through hole 541 in a center thereof corresponding to the threaded hole 180 in the protruding step 18 of the conductive plate 10. The fixing portion 542 of each elastic member 50 is received in the cavity 160 of the containing portion 16 of the conductive plate 10. The two arms 54 of each elastic member 50 can be elastically deformed to impel the pressing portion 52 onto the top sandwiching plate 42 of the heat spreader 40 after fixing the elastic member 50 on the conductive plate 10, whereby the heat spreader 40 is forced to move downwardly to have an intimate engagement with the electronic device 62.

In assembly, the condensing section 24 of the heat pipe 20 is soldered onto the fin assembly 30, whereby the bottom surface of the condensing section 24 thermally contacts the top surface of the fin assembly 30. The evaporating section 22 of the heat pipe 20 is sandwiched and soldered between the top and bottom sandwiching plates 42, 44 of the two heat spreaders 40 with a distal end of the evaporating section 22 extending beyond the heat spreaders 40 blocked under a raised portion formed on the conductive plate 10. The evaporating section 22 of the heat pipe 20 and the two heat spreaders 40 are accommodated in the channel 14 and the two rectangular holes 12 of the conductive plate 10, respectively, wherein the two heat spreaders 40 thermally contact the two electronic devices 62 mounted on the printed circuit board 60. The round corner at the joint of the evaporating section 22 and the adiabatic section 26 is received in the recess 17 of the conductive plate 10, and the adiabatic section 26 tilts from the round corner in the recess 17 to extend remotely from the conductive plate 10. The two elastic members 50 are positioned on corresponding heat spreaders 40 with the fixing portion 542 of each elastic member 50 being received in the cavity 160 of the containing portion 16 of the conductive plate 10. Two screws 56 extend through the through holes 541 of the fixing portions 540 of the two elastic members 50 and engage with the threaded holes 180 in the protruding steps 18 of the conductive plate 10, whereby the two elastic members 50 are fixed on the conductive plate 10. Thus, the heat dissipation device is assembled.

According to the disclosure, to prevent heat pipe 20 from disengaging from the conductive plate 10, the elastic members 50 are fixed on the conductive plate 10 and elastically impel the heat pipe 20 by directly contacting the heat spreaders 40, whereby the heat pipe 20 is sandwiched between the conductive plate 10 and the elastic members 50, being firmly fixed in the channel 14 of the conductive plate 10, enhancing stability of the heat dissipation device.

As disclosed, the containing portion 16 and the protruding step 18 can be respectively formed at two opposite sides of the channel 14 of the conductive plate 10 and located between the two rectangular holes 12, the fixing portion 542 of the elastic member 50 is received in the containing portion 16, the fixing portion 540 of the elastic member 50 is fastened on the protruding step 18, and the pressing portion 52 of the elastic member 50 directly contacts and elastically impels the top surface of the heat pipe 20 after fixing the elastic member 50 on the conductive plate 10.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for cooling an electronic device, comprising:
   a conductive plate;
   a heat spreader received in the conductive plate and comprising a first face for contacting the electronic device and a second face opposite to the first face;
   a heat pipe contacting the conductive plate and comprising an evaporating section received in the conductive plate and located between the first face and the second face of the heat spreader; and
   an elastic member mounted on the conductive plate for exerting an elastic force on the heat spreader and the heat pipe in the conductive plate toward the electronic device;
   wherein the heat spreader surrounds the heat pipe, and the elastic member impels the heat pipe by contacting the heat spreader; and
   wherein the heat spreader comprises a top sandwiching plate, a bottom sandwiching plate parallel to the top sandwiching plate, and a connecting plate interconnecting the top sandwiching plate and the bottom sandwiching plate, wherein the heat pipe is sandwiched between the top sandwiching plate and bottom sandwiching plate, and the first face is formed at a bottom of the bottom sandwiching plate, and the second face is formed at a top of the top sandwiching plate.

2. The heat dissipation device as claimed in claim 1, wherein the conductive plate defines a hole therein, and the heat spreader is received in the hole.

3. The heat dissipation device as claimed in claim 1, wherein the heat spreader has a U-shaped cross section.

4. The heat dissipation device as claimed in claim 1, wherein the elastic member comprises a pressing portion pressing the second face of the top sandwiching plate of the heat spreader, two arms angling from two opposite sides of the pressing portion, and two fixing portions respectively extending from two distal ends of the two arms and attached to portions of the conductive plate located at two opposite sides of the heat spreader.

5. The heat dissipation device as claimed in claim 4, wherein the conductive plate respectively forms a containing portion and a protruding step at the two opposite sides of the heat spreader, and the two fixing portions of the elastic member are respectively attached to the containing portion and the protruding step of the conductive plate.

6. The heat dissipation device as claimed in claim 5, wherein the containing portion of the conductive plate comprises a bent plate and two side plates connected thereto, the bent plate extending upwardly from the conductive plate and toward the heat spreader, and the bent plate and the two side plates cooperatively defining a cavity receiving one of the two fixing portions of the elastic member therein.

7. A heat dissipation device, comprising:
   a conductive plate;
   a heat spreader for engaging with an electronic device to absorb heat therefrom, being received in a hole defined in the conductive plate;
   a heat pipe with a first end received in heat spreader and thermally connecting the heat spreader; and
   an elastic member secured to the conductive plate and depressing heat spreader and the first end of the heat pipe for pushing the heat spreader and the first end of the heat pipe downwardly toward the electronic devices;
   wherein the heat spreader comprises a top sandwiching plate, a bottom sandwiching plate parallel to the top sandwiching plate and a connecting plate interconnecting the top sandwiching plate and the bottom sandwiching plate, the bottom sandwiching plate for contacting the electronic device, wherein the heat pipe is sandwiched between the top sandwiching plate and bottom sandwiching plate.

8. The heat dissipation device as claimed in claim 7, wherein the heat pipe comprises an evaporating section at the first end thereof, a condensing section, and an adiabatic section interconnecting the evaporating section and the condensing section, the evaporating section and the condensing section being perpendicular to the adiabatic section and located at two sides of the adiabatic section.

9. The heat dissipation device as claimed in claim 8, wherein the heat pipe is flattened, and the evaporating section of the heat pipe is soldered in the heat spreader.

10. The heat dissipation device as claimed in claim 9, further comprising a fin assembly comprising a plurality of fins, the fin assembly thermally connecting the condensing section of the heat pipe.

11. The heat dissipation device as claimed in claim 10, further comprising a clip attached to the fin assembly and the heat pipe, wherein an end of the clip surrounds a distal end of the condensing section of the heat pipe and contacts the fin assembly, and another end of the clip extends along a side surface of the fin assembly and then outwardly beyond the fin assembly.

12. The heat dissipation device as claimed in claim 7, wherein the heat spreader has a U-shaped configuration and is horizontally mounted in the hole of the conductive plate.

13. The heat dissipation device as claimed in claim 12, wherein the heat spreader is soldered to the top sandwiching plate and bottom sandwiching plate of the heat spreader.

14. The heat dissipation device as claimed in claim 7, wherein the elastic member comprises a pressing portion pressing the top sandwiching plate of the heat spreader, two arms angling from two opposite sides of the pressing portion, and two fixing portions respectively extending from two distal ends of the two arms and attached to portions of the conductive plate located at two opposite sides of the heat spreader.

15. The heat dissipation device as claimed in claim 14, wherein the conductive plate respectively forms a containing portion and a protruding step at the two opposite sides of the heat spreader, and the two fixing portions of the elastic member are respectively attached to the containing portion and the protruding step of the conductive plate.

16. The heat dissipation device as claimed in claim 15, wherein the containing portion of the conductive plate comprises a bent plate and two side plates connected thereto, the bent plate extending upwardly from the conductive plate and toward the heat spreader, and the bent plate and the two side plates cooperatively defining a cavity receiving one of the two fixing portions of the elastic member therein.

* * * * *